(12) United States Patent
Gyohten et al.

(10) Patent No.: US 7,064,993 B2
(45) Date of Patent: Jun. 20, 2006

(54) SEMICONDUCTOR MEMORY DEVICE WITH COMMON I/O TYPE CIRCUIT CONFIGURATION ACHIEVING WRITE BEFORE SENSE OPERATION

(75) Inventors: Takayuki Gyohten, Hyogo (JP); Masaru Haraguchi, Hyogo (JP); Fukashi Morishita, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 87 days.

(21) Appl. No.: 10/671,795

(22) Filed: Sep. 29, 2003

(65) Prior Publication Data

US 2004/0213064 A1 Oct. 28, 2004

(30) Foreign Application Priority Data

Mar. 18, 2003 (JP) ............... 2003-073113

(51) Int. Cl.
G11C 7/00 (2006.01)
(52) U.S. Cl. ............ 365/205; 365/230.03; 365/189.01; 365/202; 365/189.05; 365/191
(58) Field of Classification Search ................ 365/205, 365/230.03, 189.01, 202, 189.08, 191
See application file for complete search history.

(56) References Cited

U.S. PATENT DOCUMENTS

| | | | |
|---|---|---|---|
| 6,295,240 B1 * | 9/2001 | Choi ........................... | 365/207 |
| 6,314,045 B1 * | 11/2001 | Ikeda .................... | 365/230.03 |
| 6,445,632 B1 * | 9/2002 | Sakamoto ................... | 365/205 |
| 6,608,783 B1 * | 8/2003 | Frankowsky et al. ........ | 365/190 |
| 6,847,569 B1 * | 1/2005 | Sinha et al. ................ | 365/207 |

FOREIGN PATENT DOCUMENTS

JP 6-60657 A 3/1994

* cited by examiner

*Primary Examiner*—Connie C. Yoha
(74) *Attorney, Agent, or Firm*—McDermott Will & Emery LLP

(57) ABSTRACT

A connection gate circuit includes first and second N channel MOS transistors connected in series between a first bit line of a pair of bit lines and a first global IO line of a pair of IO lines, and third and fourth N channel MOS transistors connected in series between a second bit line of the pair of bit lines and a second global IO line of the pair of IO lines. The first and second N channel MOS transistors have their gates receiving a sense amplifier activation signal activating a sense amplifier. The third and fourth N channel MOS transistors have their gates receiving a column selection signal.

9 Claims, 9 Drawing Sheets

SEMICONDUCTOR MEMORY DEVICE WITH COMMON I/O TYPE CIRCUIT CONFIGURATION ACHIEVING WRITE BEFORE SENSE OPERATION

BACKGROUND OF THE INVENTION

1. Field of the Invention

The present invention generally relates to a semiconductor memory device. More particularly, the present invention relates to a semiconductor memory device of common I/O type using I/O lines for reading and writing data in common.

2. Description of the Background Art

A DRAM (Dynamic Random Access Memory), one of the typical semiconductor memory devices, is utilized in a variety of systems as a storage device suitable for a high integration and a mass storage in a semiconductor device.

Data writing in a DRAM is generally performed in the following four operations. The first is a sense operation in which a slight voltage difference appearing at a pair of bit lines in accordance with data stored in a memory cell is amplified by a sense amplifier to a great extent. The second is a write operation in which a pair of bit lines connected to a memory cell to which data is to be written are connected to a pair of I/O lines and write data on the pair of I/O lines is written to the pair of bit lines. The third is a restore operation in which storage data of a non-selected cell once corrupted in response to activation of a word line and the above written data are written back to an original memory cell. The fourth is an equalize operation in which potentials of the pair of bit lines are initialized. Data writing is performed by a series of the above four operations. The series of operations is generally referred to as a "Read modify Write operation."

In this "Read modify Write operation," after the sense amplifier is activated in response to receiving a sense amplifier activation signal and the slight voltage difference on the pair of bit lines is amplified to a sufficiently large voltage difference by the sense amplifier, a column selection signal is activated and the pair of bit lines are electrically connected to the pair of I/O lines, whereby data is written from the pair of I/O lines to the pair of bit lines.

In contrast, a "Write before Sense operation" is also known in which a column selection signal is activated without waiting for a voltage amplification by a sense amplifier so that a high-speed operation is realized. As a circuit configuration realizing this "Write before Sense operation," a DRAM of separate I/O type is generally known in which pairs of I/O lines for reading and writing data are separately provided. In this separate I/O type DRAM, the column selection signal can be activated at the same time as or before activation of the sense amplifier activation signal. Accordingly, the above-described sense operation and write operation can be performed at the same time. Therefore, an operation of the separate I/O type DRAM employing the "Write before Sense operation" is faster than that of the common I/O type DRAM employing the "Read modify Write operation."

In the separate I/O type DRAM, however, a pair of bit lines are connected to pairs of I/O lines for reading data and for writing data. Therefore, two connection gates are required for each pair of bit lines. Accordingly, a problem arises that elements required for the separate I/O type DRAM are greater in number than those required for the common I/O type DRAM. A further problem is that a circuit area of the separate I/O type DRAM is larger than that of the common I/O type DRAM.

To address the above problems, Japanese Patent Laying-Open No. 6-60657 discloses the following DRAM. In this DRAM, a configuration of I/O lines is of an I/O common type. In a connection gate circuit connecting a pair of bit lines to a pair of I/O lines, a separate I/O type circuit configuration is employed for data reading, while for data writing a gate transistor receiving a write control signal at its gate is provided between a gate transistor for reading data and the pair of bit lines. This enables a decrease in number of pair of I/O lines and elements, downsizing of a chip, and a cost reduction while taking advantage of the characteristic of the separate I/O type DRAM.

Through employment of a separate I/O type circuit configuration for achieving a high-speed operation of a DRAM, a circuit area is increased as described above. In contrast, a conventional common I/O type DRAM can reduce a circuit area in comparison with the separate I/O type DRAM. The common I/O type DRAM, however, cannot realize the "Write before Sense operation." In the following, description will be given about a problem that arises when the "Write before Sense operation" is performed in the conventional common I/O type DRAM.

If a column selection signal is activated before activation of a sense amplifier activation signal in data writing in the common I/O type DRAM, voltages of a pair of bit lines connected to a pair of I/O lines (also referred to as a "pair of selected bit lines" hereinafter) swing to the full extent. As a result, a bit line adjacent to the pair of selected bit lines may suffer coupling due to the full voltage swing at the pair of selected bit lines, and the DRAM may fail to operate properly.

That is, when a word line is activated, data stored in memory cells connected to the word line is read on a corresponding pair of bit lines as a slight voltage change, regardless of whether or not the memory cell is selected. When the pair of selected bit lines is connected to the pair of I/O lines prior to the activation of the sense amplifier and a voltage of the pair of selected bit lines changes in accordance with a voltage appearing at the pair of I/O lines in accordance with write data, a voltage of an adjacent bit line that has not yet been amplified by the sense amplifier is affected by coupling from the pair of selected bit lines. As a result, a content of storage data of the adjacent bit line affected by the coupling may be inverted.

The DRAM disclosed in Japanese Patent Laying-Open No. 6-60657 described above takes advantage of the characteristic of the separate I/O type DRAM, and also employs the common I/O type circuit configuration, thereby enabling a reduction in circuit area. In writing data, however, the column selection signal and the write control signal are not activated before the sense amplifier is activated and the voltage on the pair of bit lines is sufficiently amplified. If the column selection signal and the write control signal are activated before the activation of the sense amplifier, a problem of the above-described coupling arises. In other words, the "Write before Sense operation" can not be realized in this DRAM.

SUMMARY OF THE INVENTION

The present invention is made to solve the above described problems. An object of the present invention is to provide a semiconductor memory device realizing a "Write before Sense operation" in a common I/O type circuit configuration.

A semiconductor memory device in accordance with the present invention includes a memory cell storing data, a pair of bit lines connected to the memory cell, a sense amplifier provided corresponding to the pair of bit lines and activated in response to a sense amplifier activation signal, a pair of I/O lines transmitting the data input to and/or output from the memory cell via the pair of bit lines, and a connection gate circuit provided between the pair of bit lines and the pair of I/O lines and electrically connecting the pair of bit lines to the pair of I/O lines when the sense amplifier activation signal and a column selection signal selecting the pair of bit lines are activated.

Therefore, in accordance with the present invention, the column selection signal and the sense amplifier activation signal are utilized for activation of the connection gate circuit. The connection gate circuit is not turned on without activation of both the column selection signal and the sense amplifier activation signal. Accordingly, a pair of bit lines BL and /BL and a pair of global IO lines GIO and /GIO are not connected to each other prior to activation of the sense amplifier. As a result, a problem of coupling can be eliminated.

In accordance with the present invention as described above, the "Write before Sense operation" can be achieved in the common I/O type circuit, and a semiconductor memory device with a small circuit area operating at high speed can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
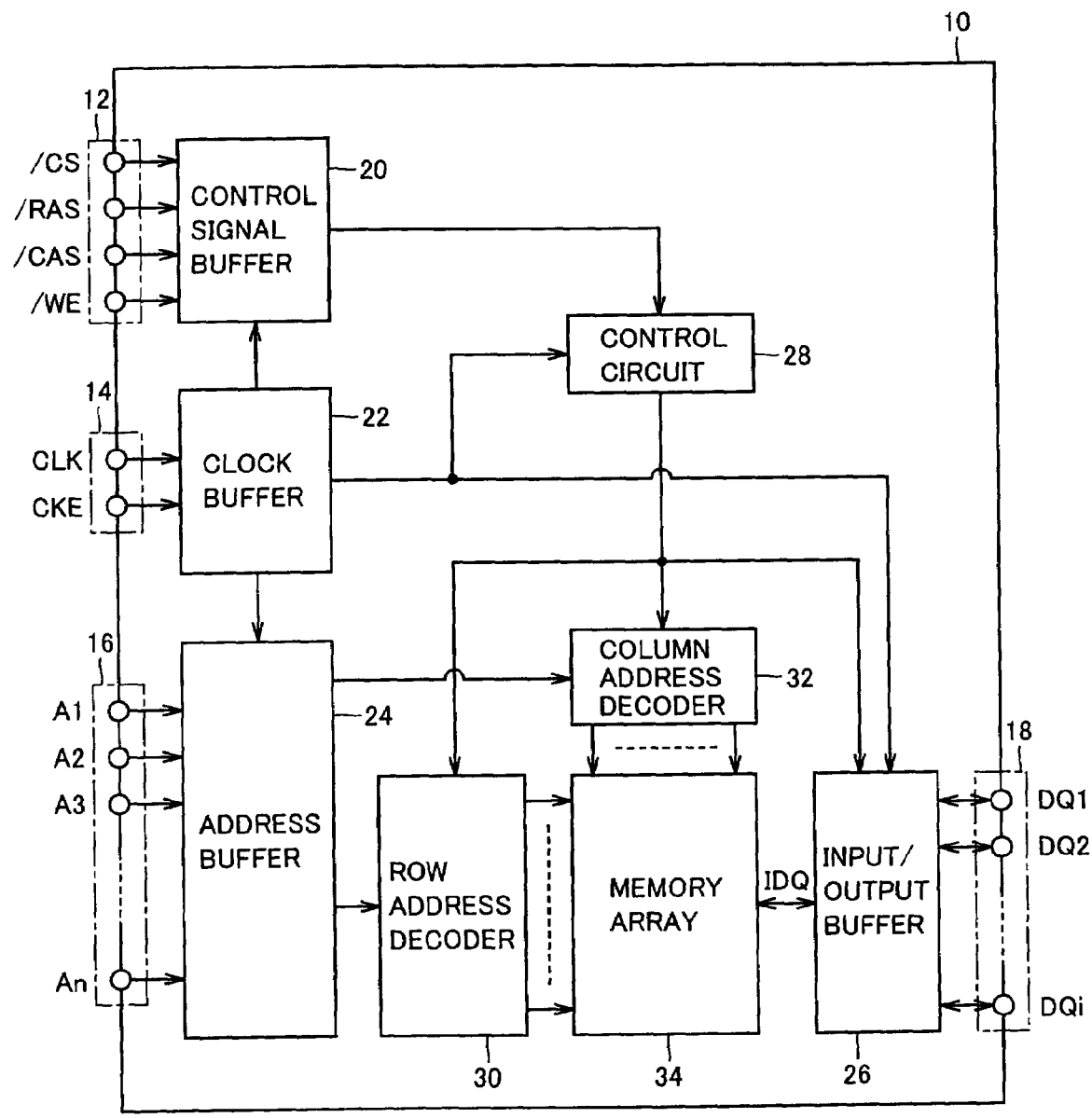
FIG. 1 is a schematic block diagram showing an overall configuration of a semiconductor memory device in accordance with a first embodiment of the present invention.

In the following, embodiments of the present invention will be described in detail with reference to the drawings. The same reference numerals will be assigned to the same or the corresponding portions in the drawings, and description thereof will not be repeated.

First Embodiment

With reference to FIG. 1, a semiconductor memory device 10 in accordance with a first embodiment of the present invention includes control signal terminals 12, clock terminals 14, address terminals 16, and data input/output terminals 18. In addition, semiconductor memory device 10 includes a control signal buffer 20, a clock buffer 22, an address buffer 24, and an input/output buffer 26. Semiconductor memory device 10 further includes a control circuit 28, a row address decoder 30, a column address decoder 32, and a memory array 34.

Control signal terminals 12 receive command control signals of a chip select signal /CS, a row address strobe signal /RAS, a column address strobe signal /CAS, and a write enable signal /WE. Clock terminals 14 receive an external clock CLK and a clock enable signal CKE. Address terminals 16 receive address signals A0 to An (n is a natural number).

In response to receiving external clock CLK, clock buffer 22 generates an internal clock. Then, clock buffer 22 outputs the internal clock to control signal buffer 20, address buffer 24, input/output buffer 26, and control circuit 28. In response to the internal clock received from clock buffer 22, control signal buffer 20 takes in and latches chip select signal /CS, row address strobe signal /RAS, column address strobe signal /CAS, and write enable signal /WE to be output to control circuit 28. In response to the internal clock received from clock buffer 22, address buffer 24 takes in and latches address signals A0 to An, and generates an internal address signal to be output to row address decoder 30 and column address decoder 32.

Data input/output terminals 18 exchange data written to and/or read from semiconductor memory device 10 with an external source. In data writing, data input/output terminals 18 receive externally input data DQ0 to DQi (i is a natural number). In data reading, data input/output terminals 18 externally output data DQ0 to DQi.

In data writing, input/output buffer 26 takes in and latches data DQ0 to DQi in response to the internal clock received from clock buffer 22. Then, input/output buffer 26 outputs internal data IDQ via a pair of I/O lines to memory array 34. In data reading, input/output buffer 26 outputs internal data IDQ received from memory array 34 via the above-mentioned pair of I/O lines to data input/output terminal 18, in response to the internal clock received from clock buffer 22.

Control circuit 28 takes in a command control signal from control signal buffer 20 in response to the internal clock received from clock buffer 22. Then, control circuit 28 controls row address decoder 30, column address decoder 32, and input/output buffer 26 based on the command control signal taken in. As a result, data DQ0 to DQi are written to and/or read from memory array 34.

Row address decoder 30 selects a word line on memory array 34 corresponding to address signals A0 to An based on an instruction from control circuit 28, and activates the selected word line by a word line driver (not shown). Column address decoder 32 selects a pair of bit lines on memory array 34 corresponding to address signals A0 to An based on an instruction from control circuit 28, and activates a corresponding column selection signal.

Figure 2:
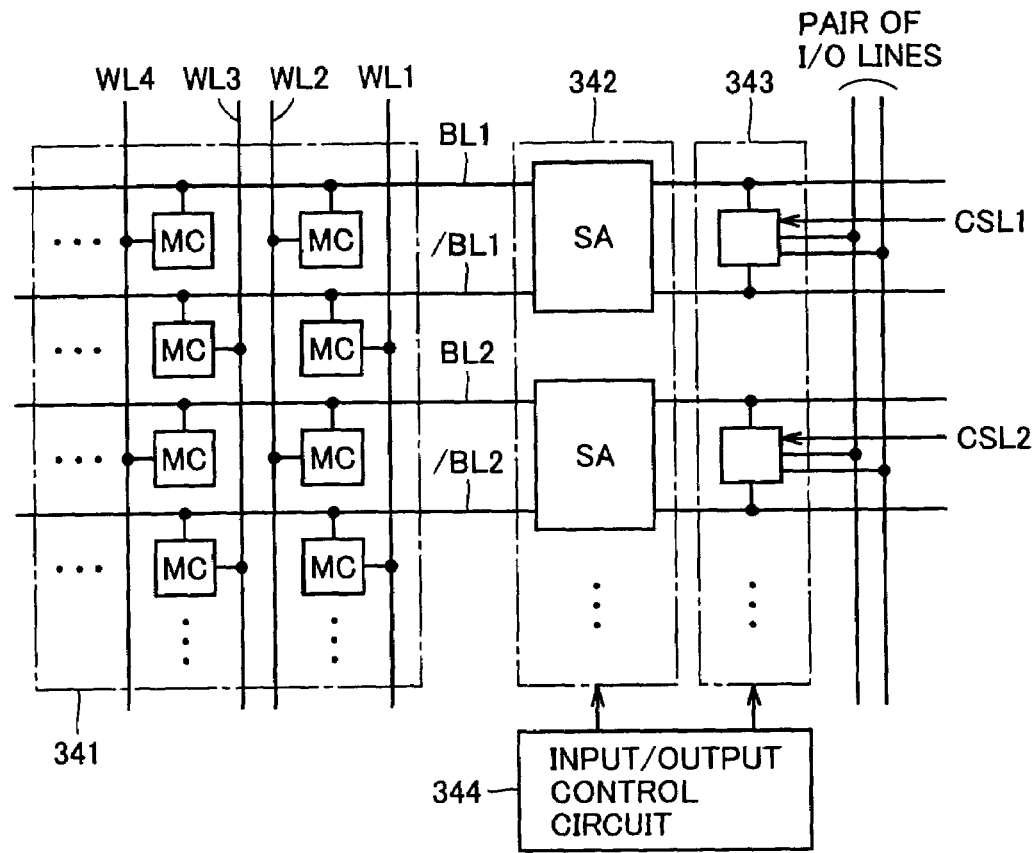
FIG. 2 is a circuit diagram showing a configuration of a memory array shown in FIG. 1.

With reference to FIG. 2, memory array 34 shown in FIG. 1 includes a memory block 341 having a plurality of memory cells storing data arranged in rows and columns, a plurality of word lines WL1, WL2 . . . provided corresponding to the memory cell rows, a plurality of pairs of bit lines BL1 and /BL1 . . . provided corresponding to the memory cell columns, a sense amplifier band 342 including a plurality of sense amplifiers provided corresponding to the respective pairs of bit lines, a connection gate band 343 including a plurality of connection gate circuits provided between the pairs of bit lines and a pair of I/O lines and operating in accordance with column selection signals CSL1, CSL2 . . . received from column address decoder 32, and an input/output control circuit 344 controlling operations of sense amplifier band 342 and connection gate band 343. Here, memory block 341 is connected via the above-described plurality of word lines WL1, WL2 . . . to row address decoder 30.

Referring again to FIG. 1, in data writing, when write data DQ is taken into input/output buffer 26, a selected word line is activated by row address decoder 30, and a column selection signal is activated by column address decoder 32. As will be described below, however, the activation of the column selection signal only is not enough to turn on the connection gate circuit. When a sense amplifier activation signal is activated by the input/output control circuit, the sense amplifier is activated, and the connection gate circuit is turned on. As a result, internal data IDQ is written from the pair of I/O lines via the connection gate circuit to a pair of selected bit lines.

The sense amplifier brings voltage levels of a selected bit line and the complementary bit line to a power supply voltage Vdd and a ground voltage GND or to ground voltage GND and power supply voltage Vdd, respectively, depending on a logic level of internal data IDQ. As a result, internal data IDQ is written to a memory cell on the memory block, that is connected to the word line activated by row address decoder 30 and to the pair of bit lines selected by column address decoder 32.

In contrast, in data reading, a pair of bit lines are precharged to a voltage Vdd/2 prior to data reading. Then, a selected word line is activated by row address decoder 30. A column selection signal is activated by column address decoder 32. Similarly to the case of data writing, however, the activation of the column selection signal only is not enough to turn on the connection gate circuit. When a sense amplifier activation signal is activated by the input/output control circuit, the sense amplifier is activated, and the connection gate circuit is turned on. As a result, potentials on the pair of selected bit lines, amplified by the sense amplifier, are transmitted to the pair of I/O lines via the connection gate circuit. Then, internal data IDQ is read.

Figure 3:
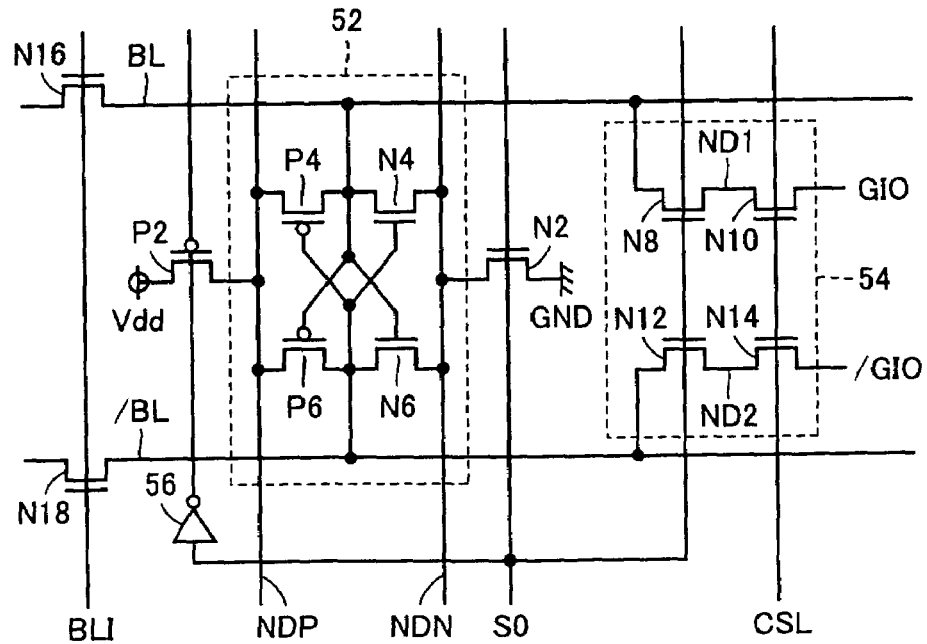
FIG. 3 is a circuit diagram showing a sense amplifier and its periphery of the semiconductor memory device in accordance with the first embodiment.

FIG. 3 is a circuit diagram showing a sense amplifier and its periphery of the semiconductor memory device in accordance with the first embodiment. For ease of illustration, one sense amplifier and its peripheral circuit only are shown in FIG. 3. In reality, however, the same configuration is repeated in other portions. In the following, description will be only given about the portion illustrated in FIG. 3.

With reference to FIG. 3, a connection gate circuit 54, an inverter 56, a P channel MOS transistor P2, and N channel MOS transistors N2, N16, and N18 are provided in a peripheral portion of a sense amplifier 52 connected to a pair of bit lines BL and /BL.

Sense amplifier 52 includes P channel MOS transistors P4, P6 and N channel MOS transistors N4, N6. P channel MOS transistor P4 is connected between a node NDP and bit line BL, and has its gate connected to bit line /BL. P channel MOS transistor P6 is connected between node NDP and bit line /BL, and has its gate connected to bit line BL. N channel MOS transistor N4 is connected between bit line BL and a node NDN, and has its gate connected to bit line /BL. N channel MOS transistor N6 is connected between bit line /BL and node NDN, and has its gate connected to bit line BL.

P channel MOS transistor P2 is connected between a power supply node Vdd and node NDP, and has its gate receiving an output signal from inverter 56. N channel MOS transistor N2 is connected between node NDN and a ground node GND, and has its gate receiving a sense amplifier activation signal S0. Inverter 56 outputs an inverted signal of sense amplifier activation signal S0.

Sense amplifier 52 is controlled by sense amplifier activation signal S0 output from the input/output control circuit (not shown). When sense amplifier activation signal S0 is at an H (logical high) level, sense amplifier 52 is activated. When sense amplifier activation signal S0 is at an L (logical low) level, sense amplifier 52 is inactivated. Sense amplifier 52, when activated, amplifies a slight voltage difference between pair of bit lines BL and /BL.

Connection gate circuit 54 includes N channel MOS transistors N8 to N14, and nodes ND1 and ND2. N channel MOS transistor N8 is connected between bit line BL and node ND1, and has its gate receiving sense amplifier activation signal S0. N channel MOS transistor N11 is connected between node ND1 and a global IO line GIO, and has its gate receiving a column selection signal CSL. N channel MOS transistor N12 is connected between bit line /BL and node ND2, and has its gate receiving sense amplifier activation signal S0. N channel MOS transistor N14 is connected between node ND2 and a global IO line /GIO, and has its gate receiving column selection signal CSL.

Here, global IO line GIO and global IO line /GIO form a "pair of I/O lines."

Connection gate circuit 54 is controlled by sense amplifier activation signal S0 and column selection signal CSL output from column address decoder 32 (not shown). N channel MOS transistors N8 and N1 having their gates receiving sense amplifier activation signal S0 and column selection signal CSL, respectively, are connected in series between bit line BL and global IO line GIO. N channel MOS transistors N12 and N14 having their gates receiving sense amplifier activation signal S0 and column selection signal CSL, respectively, are connected in series between bit line /BL and global IO line /GIO. Accordingly, when sense amplifier activation signal S0 and column selection signal CSL are both at the H level, connection gate circuit 54 turns on and electrically connects pair of bit lines BL and /BL to pair of global IO lines GIO and /GIO.

N channel MOS transistors N16 and N18 are connected between the memory block (not shown) and pair of bit lines BL and /BL, respectively. N channel MOS transistors N16 and N18 have their gates both receiving a bit line connection signal BLI. When a voltage level of bit line connection signal BLI is ground voltage GND, N channel MOS transistors N16 and N18 are turned off, and electrically isolate the memory block from pair of bit lines BL and /BL.

Figure 4:
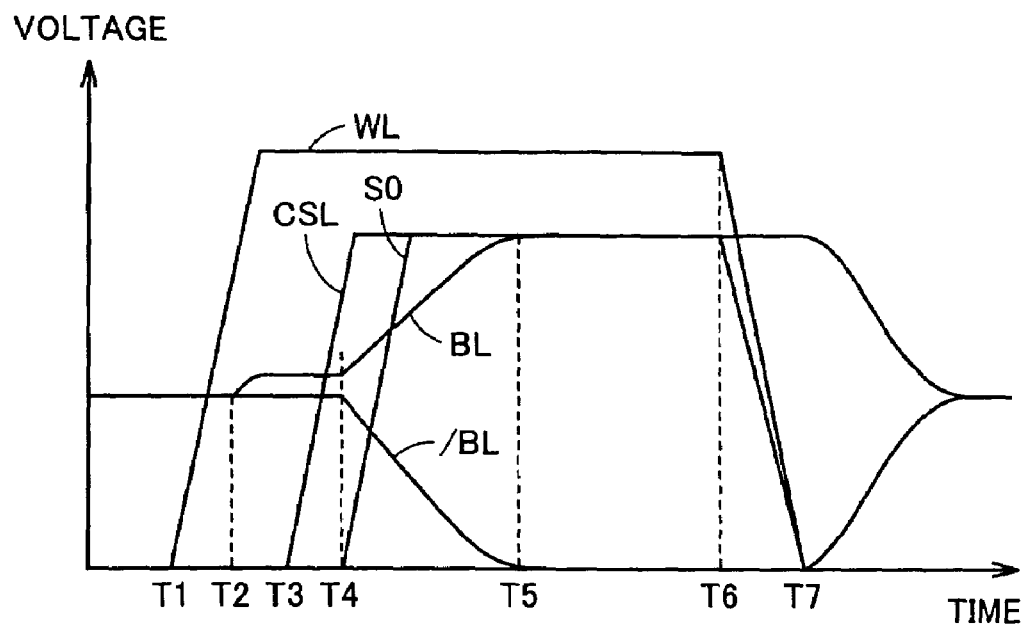
FIG. 4 is an operational waveform diagram representing a read operation of the circuit shown in FIG. 3.

FIG. 4 is an operational waveform diagram representing a read operation of the circuit in FIG. 3.

With reference to FIG. 4, word line WL is activated at time T1. At time T2, slight changes in potential appear at bit lines BL and /BL in accordance with data stored in a memory cell. At time T3, column selection signal CSL is activated. Connection gate circuit 54, however, is not turned on, since sense amplifier activation signal S0 is at an inactive level. Accordingly, pair of bit lines BL and /BL are electrically isolated from pair of global IO lines GIO and /GIO.

At time T4, sense amplifier activation signal S0 is activated. Then, sense amplifier 52 is activated. Voltage levels of pair of bit lines BL and /BL are amplified in directions opposite to each other. At the same time, N channel MOS transistors N8 and N12 of selection gate circuit 54 are turned on. Then, connection gate circuit 54 is turned on. Pair of bit lines BL and /BL are electrically connected to pair of global IO lines GIO and /GIO. Data is then read on pair of global IO lines GIO and /GIO.

A restore operation is performed at and after time T5. The storage data sufficiently amplified at time T5 is rewritten to the memory cell. At time T6, word line WL, column selection signal CSL, and sense amplifier activation signal S0 are inactivated. At time T7, the voltage levels of pair of bit lines BL and /BL are initialized by a bit line equalize circuit (not shown).

Figure 5:
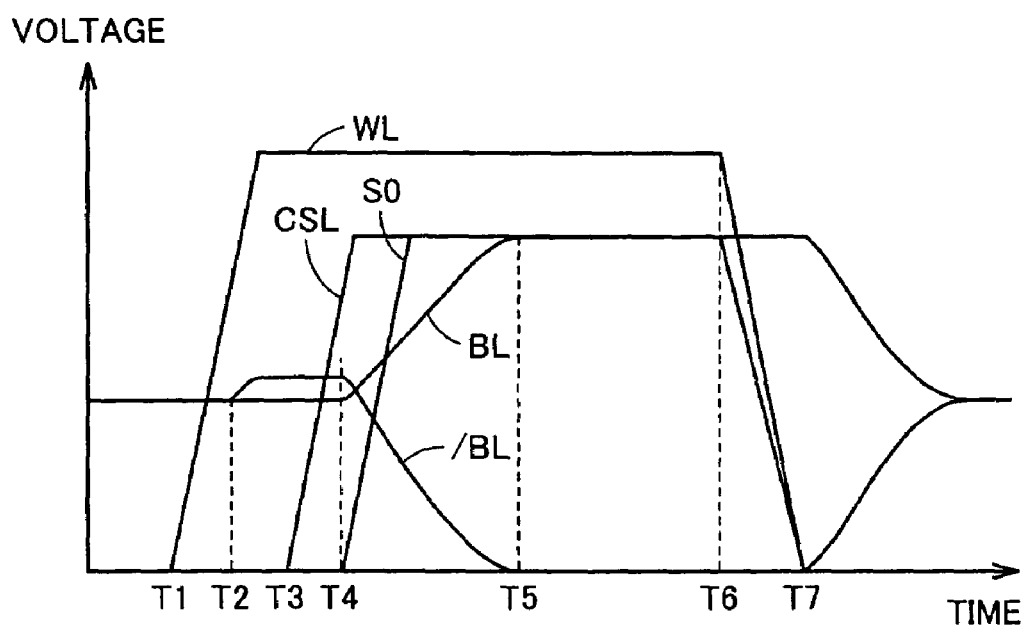
FIG. 5 is an operational waveform diagram representing a write operation of the circuit shown in FIG. 3.

FIG. 5 is an operational waveform diagram representing a write operation of the circuit in FIG. 3.

With reference to FIG. 5, operational waveforms between time T1 and time T3 are the same as those in the read operation in FIG. 4. At time T4, sense amplifier activation signal S0 is activated. Then, sense amplifier 52 is activated. At the same time, N channel MOS transistors N8 and N12 of connection gate circuit 54 are turned on. Accordingly, connection gate circuit 54 is turned on. Pair of bit lines BL and /BL are then electrically connected to pair of global IO lines GIO and /GIO. Then, data is written from pair of global IO lines GIO and /GIO to pair of bit lines BL and /BL. The written data is amplified by sense amplifier 52.

A restore operation is performed at and after time T5. Operational waveforms at and after time T5 are the same as those in the read operation in FIG. 4.

As described above, since sense amplifier activation signal S0 is taken into connection gate circuit 54, connection gate circuit 54 is not turned on before sense amplifier 52 is activated. In other words, pair of bit lines BL and /BL are not electrically connected to pair of global IO lines GIO and /GIO before sense amplifier 52 is activated. Therefore, the problem of coupling as described earlier is eliminated.

Before sense amplifier 52 is activated, data is previously written to pair of global IO lines GIO and /GIO having a large parasitic capacitance, and column selection signal CSL is activated. As a result, data writing from pair of global IO lines GIO and /GIO to pair of bit lines BL and /BL can be initiated at the same time as the activation of sense amplifier 52. That is, the "Write before Sense operation" is realized.

It is noted that the circuit shown in FIG. 3 can also operate similarly to a conventional common I/O type circuit.

Figure 6:
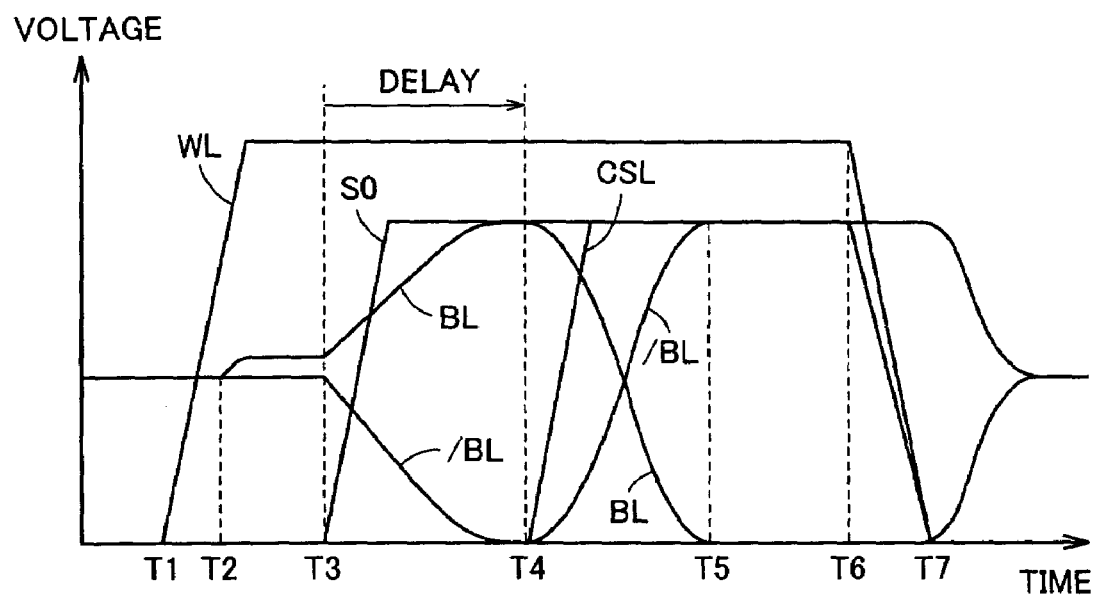
FIG. 6 is an operational waveform diagram in a case where a column selection signal is activated after activation of a sense amplifier in the write operation of the circuit shown in FIG. 3.

FIG. 6 is an operational waveform diagram in the case where the column selection signal is activated after activation of the sense amplifier in the write operation of the circuit in FIG. 3.

With reference to FIG. 6, word line WL is activated at time T1. At time T2, slight changes in potential appear at bit lines BL and /BL in accordance with data stored in the memory cell. When sense amplifier activation signal S0 is activated at time T3, sense amplifier 52 is activated. Then, the voltage levels of pair of bit lines BL and /BL are amplified in directions opposite to each other.

When a voltage difference between pair of bit lines BL and /BL is sufficiently amplified at time T4, column selection signal CSL is activated. Then, N channel MOS transistors N10 and N14 of connection gate circuit 54 are turned on. Accordingly, connection gate circuit 54 is turned on and pair of bit lines BL and /BL are electrically connected to pair of global IO lines GIO and /GIO. Then, data is written from pair of global IO lines GIO and /GIO to pair of bit lines BL and /BL. The written data is amplified by sense amplifier 52.

A restore operation is performed at and after time T5. Operational waveforms at and after time T5 are the same as those in the write operation in FIG. 5.

In this semiconductor memory device 10, however, activation of column selection signal CSL at the same time as or prior to activation of sense amplifier activation signal S0 does not cause the problem of coupling. Therefore, it is unnecessary to set a delay time between the activation of sense amplifier activation signal S0 and the activation of column selection signal CSL, as shown in FIG. 6. Accordingly, a high-speed operation can be achieved as shown in FIG. 5.

Figure 7:
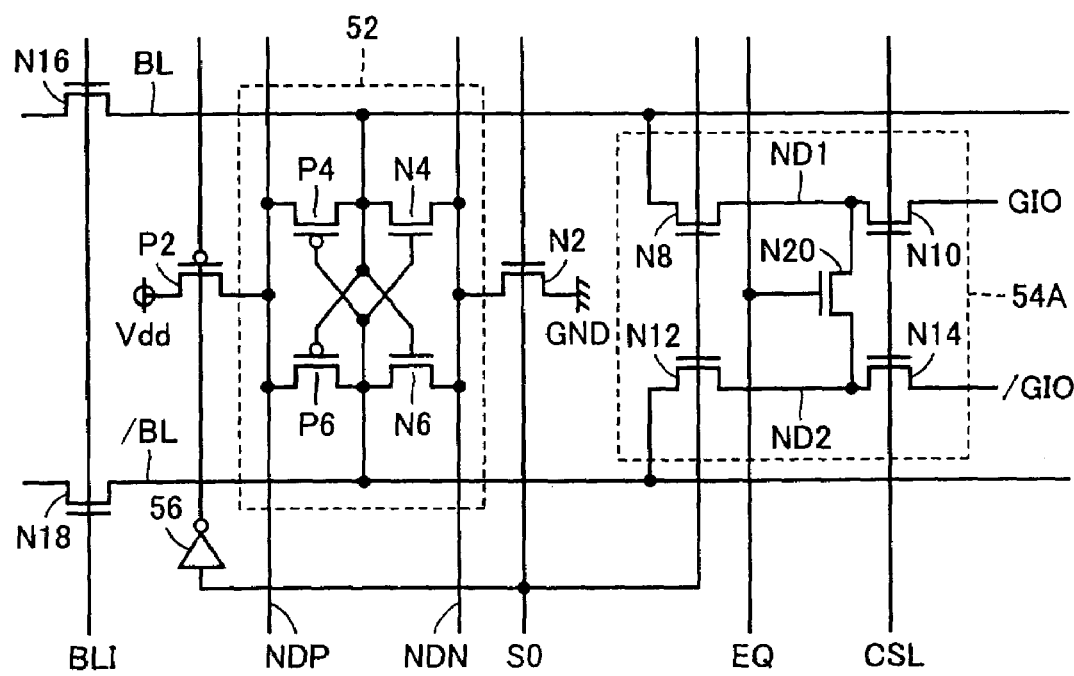
FIG. 7 is a circuit diagram showing the sense amplifier and its periphery in a case where a connection gate circuit in FIG. 3 has an equalize function.

FIG. 7 is a circuit diagram showing the sense amplifier and its periphery in the case where the connection gate circuit in FIG. 3 has an equalize function.

With reference to FIG. 7, the circuit includes a connection gate circuit 54A, instead of connection gate circuit 54, in the circuit configuration shown in FIG. 3. Connection gate circuit 54A additionally includes an N channel MOS transistor N20 in the configuration of connection gate circuit 54. N channel MOS transistor N20 is connected between nodes ND1 and ND2, and has its gate receiving an equalize signal EQ.

When equalize signal EQ output from the input/output control circuit (not shown) is at the H level, N channel MOS transistor N20 is turned on and causes nodes ND1 and ND2 to attain the same potential. In other words, N channel MOS transistor N20 forms an "equalize circuit."

Equalize signal EQ is activated in an equalize operation of pair of bit lines BL and /BL. Therefore, nodes ND1 and ND2 of connection gate circuit 54A are equalized at the same time as pair of bit lines BL and /BL are equalized.

Provision of this equalize circuit prevents nodes ND1 and ND2 from being in an unstable state when pair of bit lines BL and /BL are electrically connected to pair of global IO lines GIO and /GIO. Accordingly, potentials of pair of bit lines BL and /BL are quickly transmitted to nodes ND1 and ND2. As a result, high-speed data transmission between pair of bit lines BL and /BL and pair of global IO lines GIO and /GIO can be achieved.

As described above, in the semiconductor memory device in accordance with the first embodiment, connection gate circuits 54 and 54A are not turned on unless column selection signal CSL and sense amplifier activation signal S0 are both activated. Therefore, pair of bit lines BL and /BL are not connected to pair of global IO lines GIO and /GIO prior to the activation of sense amplifier 52. Accordingly, the semiconductor memory device in accordance with the first embodiment can achieve the common I/O type circuit configuration without the problem of coupling, and can thus realize the "Write before Sense operation." As a result, a semiconductor memory device with a small circuit area realizing a high-speed operation can be achieved.

Moreover, provision of the equalize circuit in connection gate circuit 54A further improves the operating speed.

Second Embodiment

An overall configuration of a semiconductor memory device in accordance with a second embodiment is the same as that of the semiconductor memory device shown in FIG. 1.

Figure 8:
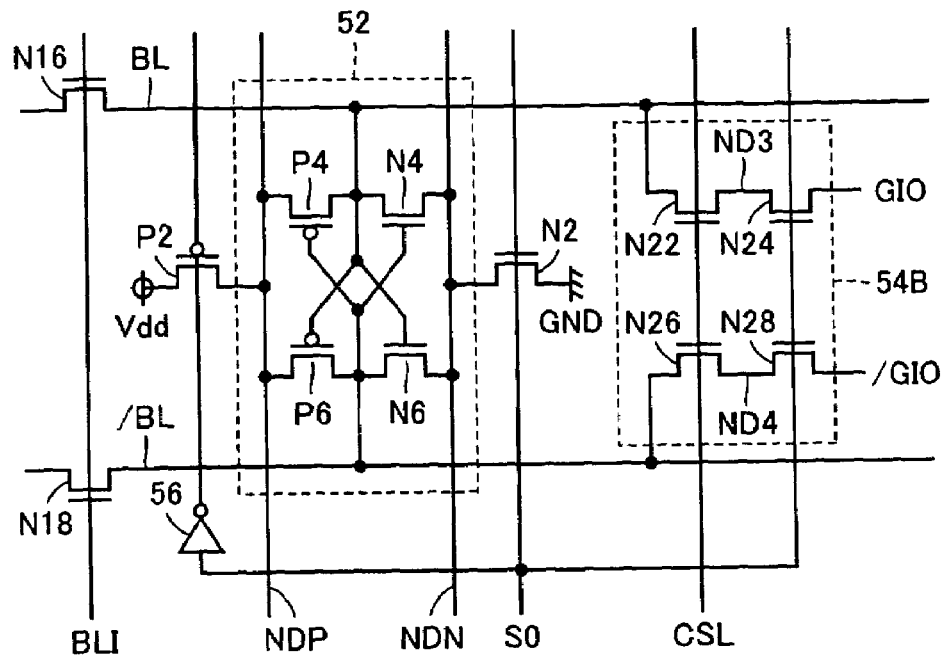
FIG. 8 is a circuit diagram showing a sense amplifier and its periphery of a semiconductor memory device in accordance with a second embodiment of the present invention.

FIG. 8 is a circuit diagram showing a sense amplifier and its periphery of the semiconductor memory device in accordance with the second embodiment. As in the case of FIG. 3, one sense amplifier and its peripheral circuit only are shown in FIG. 8 for ease of illustration. In reality, however, the same configuration is repeated in other portions. In the following, description will be only given about the portion illustrated in FIG. 8.

With reference to FIG. 8, the circuit includes a connection gate circuit 54B, instead of connection gate circuit 54, in the circuit configuration shown in FIG. 3. Connection gate circuit 54B includes N channel MOS transistors N22 to N28, and nodes ND3, ND4.

N channel MOS transistor N22 is connected between bit line BL and node ND3, and has its gate receiving column selection signal CSL. N channel MOS transistor N24 is connected between node ND3 and global IO line GIO, and has its gate receiving sense amplifier activation signal S0. N channel MOS transistor N26 is connected between bit line /BL and node ND4, and has its gate receiving column selection signal CSL. N channel MOS transistor N28 is connected between node ND4 and global IO line /GIO, and has its gate receiving sense amplifier activation signal S0.

Connection gate circuit 54B is different from connection gate circuit 54 of the first embodiment in that N channel MOS transistors N22 and N26 respectively connected to pair of bit lines BL and /BL have their gates receiving column selection signal CSL, and that N channel MOS transistors N24 and N28 respectively connected to pair of global IO lines GIO and /GIO receive sense amplifier activation signal S0. Connection gate circuit 54B, however, is the same in function as connection gate circuit 54 of the first embodiment.

Figure 9:
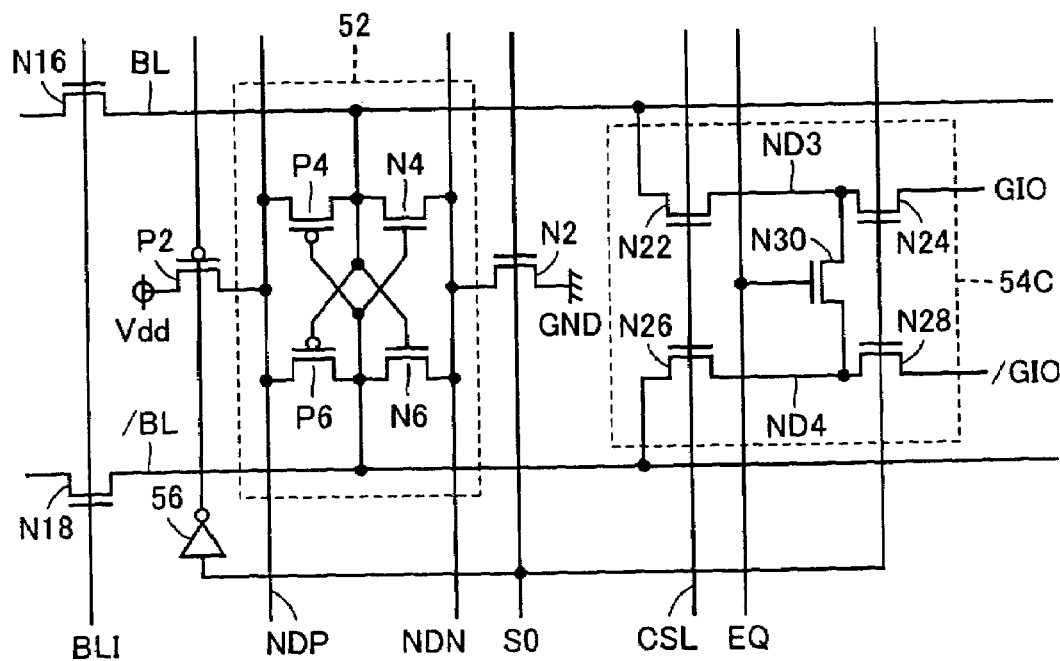
FIG. 9 is a circuit diagram showing the sense amplifier and its periphery in a case where a gate connection circuit in FIG. 8 has an equalize function.

FIG. 9 is a circuit diagram showing the sense amplifier and its periphery in the case where the connection gate circuit in FIG. 8 has a equalize function.

With reference to FIG. 9, the circuit includes a connection gate circuit 54C, instead of connection gate circuit 54B, in the circuit configuration shown in FIG. 8. Connection gate circuit 54C additionally includes an N channel MOS transistor N30 in the configuration of connection gate circuit 54B in FIG. 8. N channel MOS transistor N30 is connected between nodes ND3 and ND4, and has its gate receiving equalize signal EQ.

When equalize signal EQ output from the input/output control circuit (not shown) is at the H level, N channel MOS transistor N30 is turned on, and causes nodes ND3 and ND4 to attain the same potential. In other words, N channel MOS transistor N30 forms an "equalize circuit." A function of this equalize circuit is the same as the equalize function of N channel MOS transistor N20 described in the first embodiment.

As in the circuits shown in FIGS. 8 and 9, by placing the transistor having its gate receiving sense amplifier activation signal S0 on the pair of global IO lines GIO and /GIO side, the relevant transistor can be shared by a plurality of connection gate circuits sharing pair of global IO lines GIO and /GIO.

Figure 10:
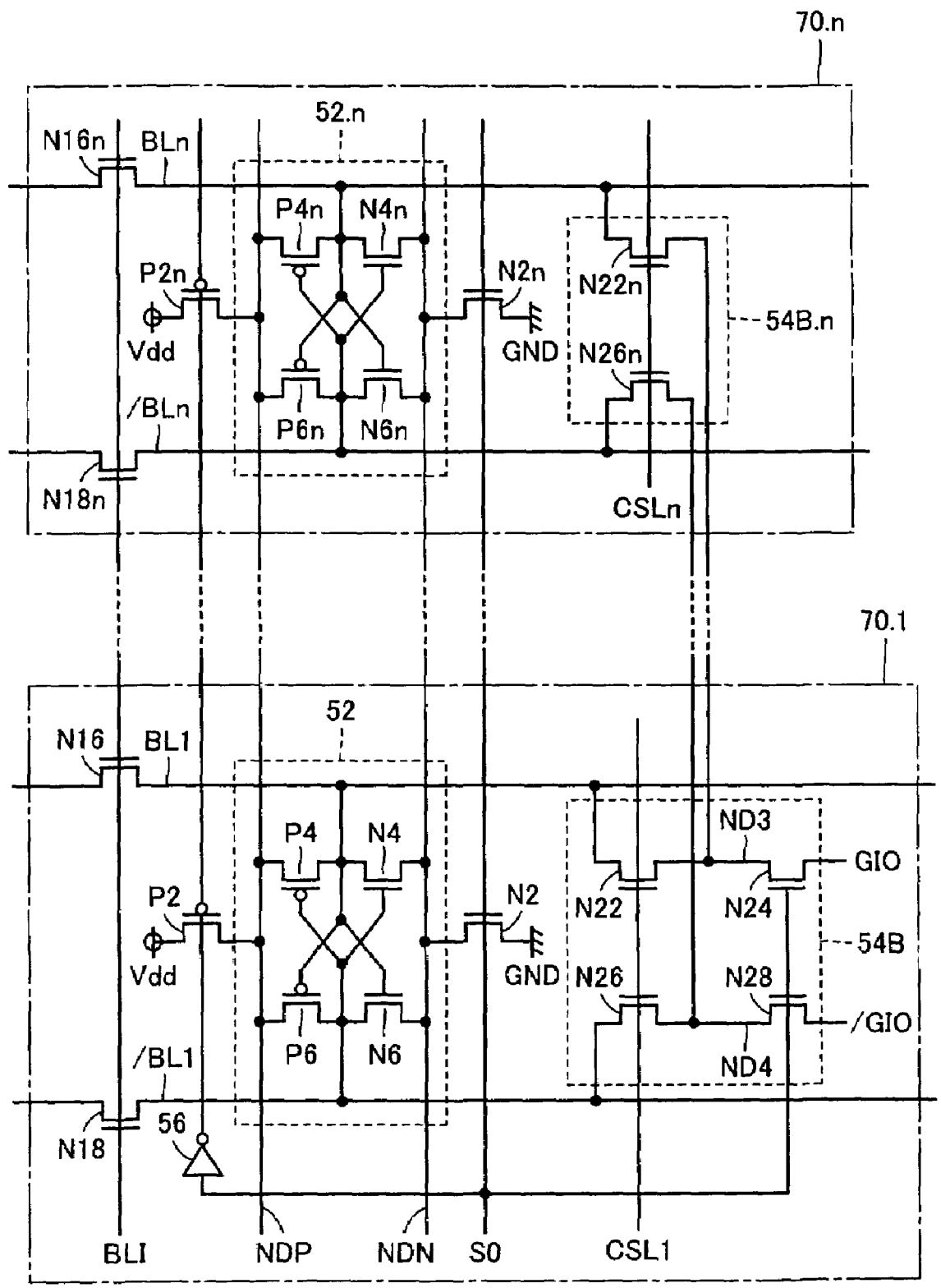
FIG. 10 is a circuit diagram showing a sense amplifier and its periphery in a case where a transistor having its gate receiving a sense amplifier activation signal is shared by a plurality of connection gate circuits.

FIG. 10 is a circuit diagram showing a sense amplifier and its periphery in the case where a transistor having its gate receiving sense amplifier activation signal S0 is shared by a plurality of connection gate circuits.

With reference to FIG. 10, a circuit 70.1 is a circuit corresponding to column selection signal CSL1. A circuit configuration thereof is the same as that shown in FIG. 8. A circuit 70.n is a circuit corresponding to a column selection signal CSLn. Circuit 70.n includes a connection gate circuit 54B.n, instead of connection gate circuit 54B, in the circuit configuration shown in FIG. 8.

Connection gate circuit 54B.n includes N channel MOS transistors N22n and N26n. N channel MOS transistor N22n is connected between bit line BL and node ND3, and has its gate receiving column selection signal CSLn. N channel MOS transistor N26n is connected between bit line /BL and node ND4, and has its gate receiving column selection signal CSL1.

Connection gate circuits 54B and 54B.n share N channel MOS transistors N24 and N28 included in connection gate circuit 54B. Circuits 70.1 and 70.n share pair of global IO lines GIO and /GIO. However, column selection signals CSL1 and CSLn are not activated at the same time. Thus, a pair of bit lines BL1 and /BL1 are not connected to pair of common global IO lines GIO and /GIO at the same time as a pair of bit lines BLn and /BLn are connected to pair of common global IO lines GIO and /GIO. As such, by sharing the transistors having their gates receiving sense amplifier activation signal S0 among circuits 70.1 and 70.n, the number of elements can be decreased, and additionally, a circuit area can further be reduced.

In the above description, P channel MOS transistor P2 and N channel MOS transistor N2 activating sense amplifier 52, and a P channel MOS transistor P2n and an N channel MOS transistor N2n activating a sense amplifier 52.n are provided for sense amplifiers 52 and 52.n, respectively. Alternatively, a set of P channel MOS transistor P2 and N channel MOS transistor N2, for example, may be shared by sense amplifiers 52 and 52.n.

Figure 11:
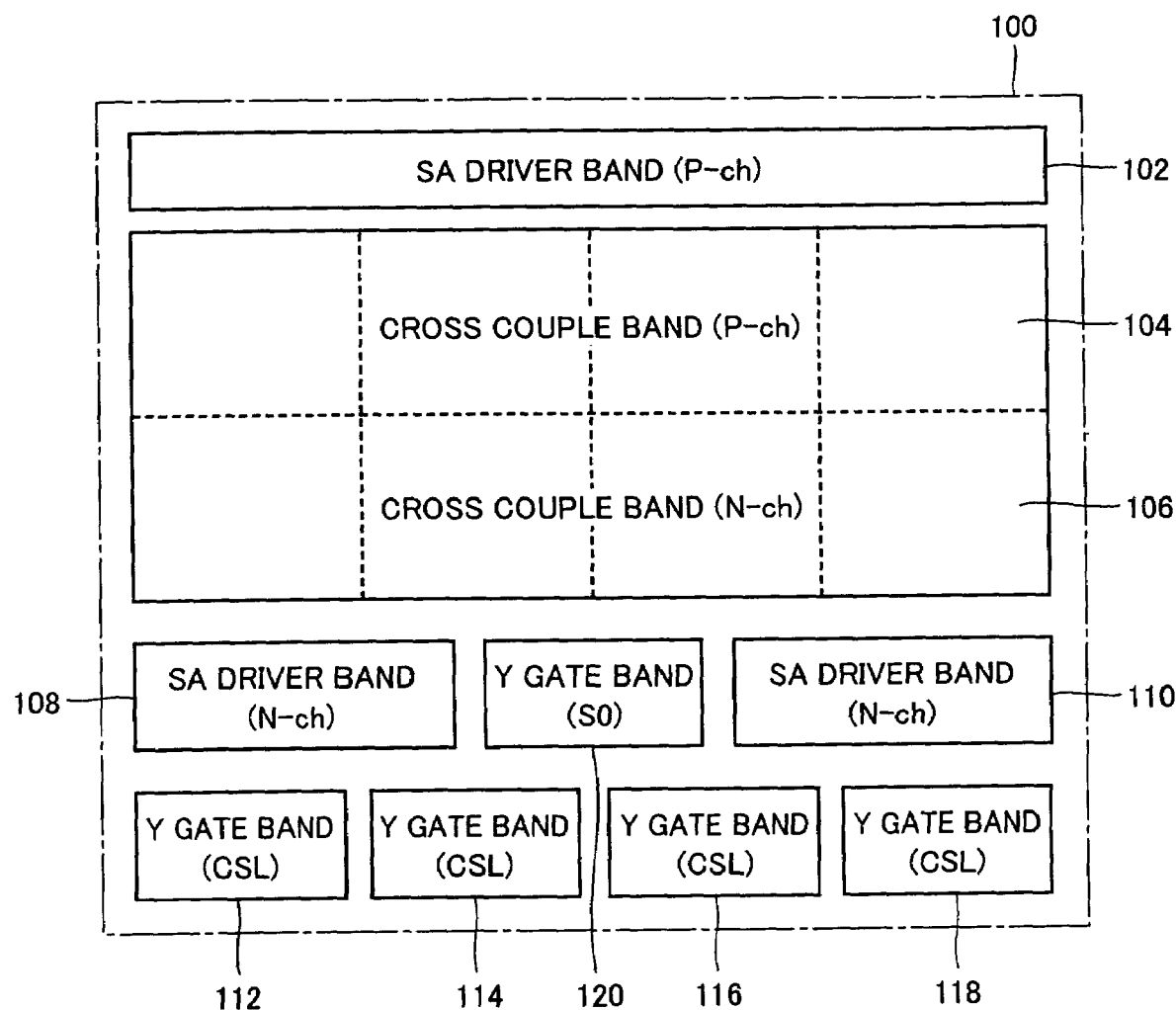
FIG. 11 is a plan view schematically showing a two-dimensional configuration of the circuit shown in FIG. 10.

FIG. 11 is a plan view schematically illustrating a two-dimensional configuration of the circuit shown in FIG. 10.

With reference to FIGS. 11 and 10, an SA driver band 102 is a region where P channel MOS transistors P2 and P2n are provided. A cross couple band 104 is a region where P channel MOS transistors P4, P4n, P6, and P6n are provided. A cross couple band 106 is a region where N channel MOS transistors N4, N4n, N6, and N6n are provided.

SA driver bands 108 and 110 are regions where N channel MOS transistors N2 and N2n are provided. Y gate bands 112 to 118 are regions where N channel MOS transistors N22, N22n, N26, and N26n having their gates receiving column selection signal CSL1 or CSLn are provided. A Y gate band 120 is a region where N channel MOS transistors N24 and N28 having their gates receiving sense amplifier activation signal S0 are provided.

In general, an N channel MOS transistor is smaller in area than a P channel MOS transistor. Therefore, an area occupied by SA driver bands 108 and 110 where N channel MOS transistors are provided is smaller than an area occupied by SA driver band 102 where P channel MOS transistors are provided. Accordingly, a free space is formed between SA driver bands 108 and 110.

In contrast, in the circuit shown in FIG. 10, N channel MOS transistors N24 and N28 receiving sense amplifier activation signal S0 are shared by a plurality of connection gate circuits 54B and 54B.n. Therefore, an area occupied by Y gate band 120 is small. Y gate band 120 has conventionally been provided opposite to SA driver bands 108 and 110 with respect to Y gate bands 112 to 118. In the present invention, however, Y gate band 120 is provided at the above-mentioned free space. As a result, the circuit area can be reduced.

In the circuit shown in FIG. 10 as well, the connection gate circuit can have an equalize function. In this case, an equalize circuit causing nodes ND3 and ND4 to attain the same potential can also be shared by the plurality of connection gate circuits. This is because the transistors having their gates receiving sense amplifier activation signal S0 are shared by the plurality of connection gate circuits and nodes ND3 and ND4 are shared by the plurality of connection gate circuits.

As described above, the semiconductor memory device in accordance with the second embodiment can produce the effect similar to that of the first embodiment.

In addition, connection gate circuits 54B and 54B.n connected to pair of common global IO lines GIO and /GIO can share N channel MOS transistors N24 and N28 having their gates receiving sense amplifier activation signal S0. In this case, the circuit area can further be reduced.

Third Embodiment

An overall configuration of a semiconductor memory device in accordance with a third embodiment is the same as that of the semiconductor memory device shown in FIG. 1.

Figure 12:
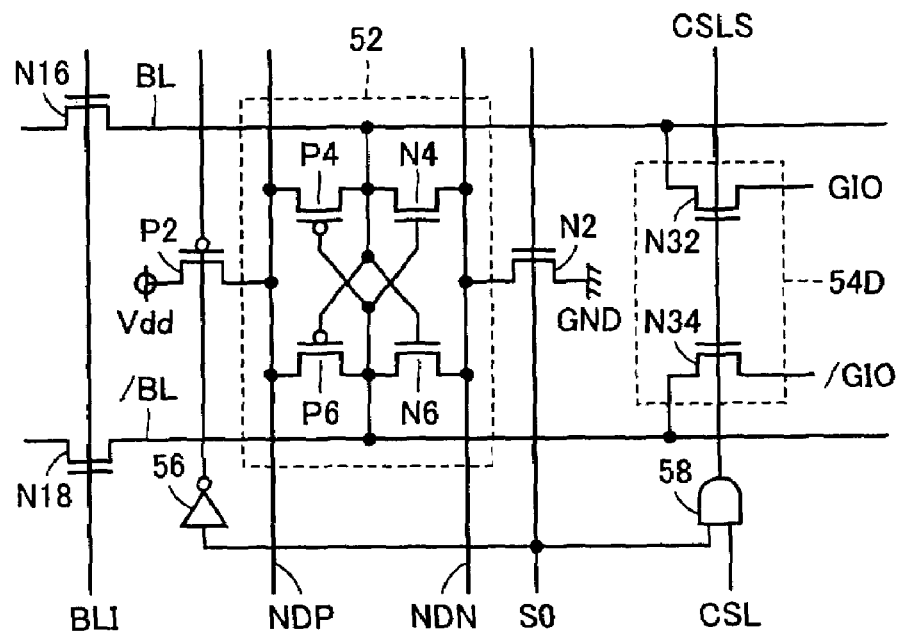
FIG. 12 is a circuit diagram showing a sense amplifier and its periphery of a semiconductor memory device in accordance with a third embodiment of the present invention.

FIG. 12 is a circuit diagram showing a sense amplifier and its periphery of the semiconductor memory device in accordance with the third embodiment. Similarly to FIG. 3, for ease of illustration, one sense amplifier and its peripheral circuit only are shown in FIG. 12. In reality, however, the same configuration is repeated in other portions. In the following, description will be only given about the portion illustrated in FIG. 12.

With reference to FIG. 12, the circuit additionally includes an AND gate 58, and also includes a connection gate circuit 54D instead of connection gate circuit 54 in the circuit configuration shown in FIG. 3. Sense amplifier activation signal S0 and column selection signal CSL are logically AND'd by AND gate 58. AND gate 58 outputs a result of the logical operation to connection gate circuit 54D. Here, AND gate 58 forms a "logic gate circuit."

Connection gate circuit 54D includes N channel MOS transistors N32 and N34. N channel MOS transistor N32 is connected between bit line BL and global IO line GIO, and has its gate receiving an output signal CSLS from AND gate 58. N channel MOS transistor N34 is connected between bit line /BL and global IO line /GIO, and has its gate receiving output signal CSLS from AND gate 58.

When output signal CSLS from AND gate 58 is at the H level, that is, when sense amplifier activation signal S0 and column selection signal CSL are both at the H level, connection gate circuit 54D electrically connects pair of bit lines BL and /BL to pair of global IO lines GIO and /GIO. As a result, this circuit also realizes a function similar to that achieved by the circuit shown in FIG. 3.

Controlling the operation of connection gate circuit 54D by output signal CSLS from AND gate 58 makes it possible to reduce the circuit area compared to the area of the circuit shown in FIG. 3 or 8 in accordance with the first or second embodiment. That is, the number of elements in a memory array configured of the circuit shown in FIG. 12 can be smaller than that of elements in a memory array configured of the circuit shown in FIG. 3 or 8 by twice the number of sense amplifiers. Addition of AND gate 58 increases the number of elements by only twice the number of memory block stage. Therefore, the number of elements as a whole can be reduced, and thus, the circuit area can be decreased.

Figure 13:
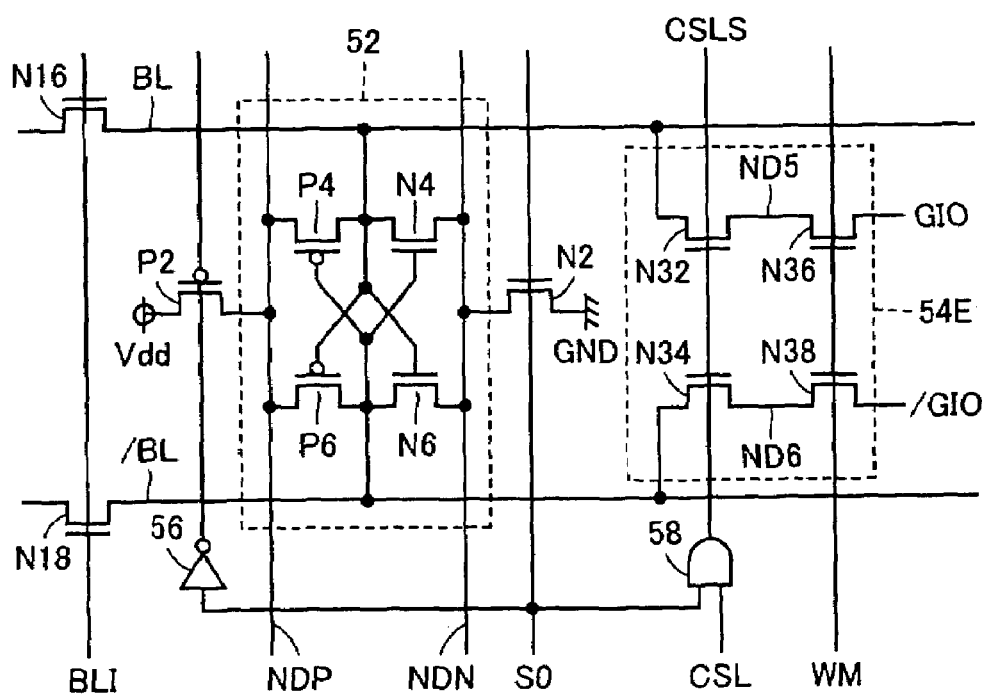
FIG. 13 is a circuit diagram in a case where a connection gate circuit in FIG. 12 has a write mask function.

FIG. 13 is a circuit diagram in the case where the connection gate circuit in FIG. 12 has a write mask function.

With reference to FIG. 13, the circuit includes a connection gate circuit 54E instead of connection gate circuit 54D in the circuit configuration shown in FIG. 12. Connection gate circuit 54E additionally includes N channel MOS transistors N36 and N38, and nodes ND5 and ND6 in the configuration of connection gate circuit 54D.

N channel MOS transistors N32 and N34 are connected to nodes ND5 and ND6, respectively. N channel MOS transistor N36 is connected between node ND5 and global IO line GIO, and has its gate receiving a write mask signal WM. N channel MOS transistor N38 is connected between node ND6 and global IO line /GIO, and has its gate receiving write mask signal WM.

Connection gate circuit 54E is controlled by sense amplifier activation signal S0, column selection signal CSL, and write mask signal WM output from the input/output control circuit (not shown). That is, when write mask signal WM is at the H level, N channel MOS transistors N36 and N38 are turned on, and the circuit in FIG. 13 operates similarly to the circuit in FIG. 12. In contrast, when write mask signal WM is at the L level, N channel MOS transistors N36 and N38 are turned off. Connection gate circuit 54E electrically isolates pair of bit lines BL and /BL from pair of global IO lines GIO and /GIO. As a result, write data is masked.

Figure 14:
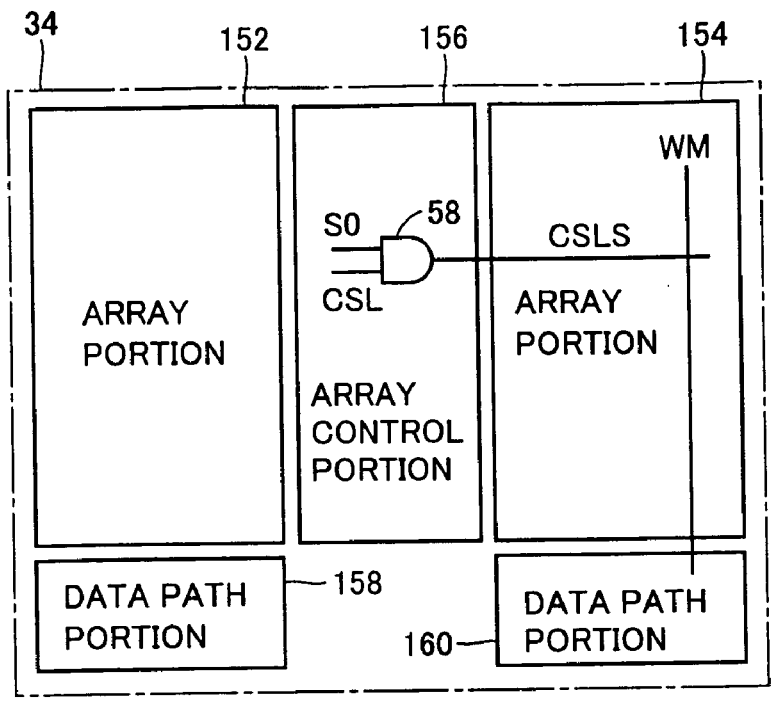
FIG. 14 is a plan view schematically showing a two-dimensional configuration of a memory array in which the circuit in FIG. 13 is provided.

FIG. 14 is a plan view schematically showing a two-dimensional configuration of memory array 34 in which the circuit in FIG. 13 is provided.

With reference to FIG. 14, memory array 34 includes array portions 152 and 154, an array control portion 156, and data path portions 158 and 160. Memory cells and sense amplifier 52 are provided in array portions 152 and 154. Drivers respectively activating a word line activation signal, bit line connection signal BLI, sense amplifier activation signal S0, column selection signal CSL and equalize signal EQ, and AND gate 58 shown in FIG. 13 are provided for array control portion 156. A preamplifier, a write/read driver and the like driving pair of global IO lines GIO and /GIO are provided at data path portions 158 and 160.

With provision of AND gate 58 at array control portion 156 as described above, connection gate circuit 54E included in the array portion is configured of transistors connected in series only. As a result, a layout efficiency can be improved.

In the above description, AND gate 58 is provided at array control portion 156. AND gate 58, however, may be provided at, e.g., a shunt portion or the like. Here, the shunt portion is a portion in a memory cell array included in an array portion, where gate interconnection lines of high resistance are connected to a metal interconnection line of low resistance via contacts at regular intervals therebetween, for the purpose of decreasing the high resistance values of the gate interconnection lines.

Figure 15:
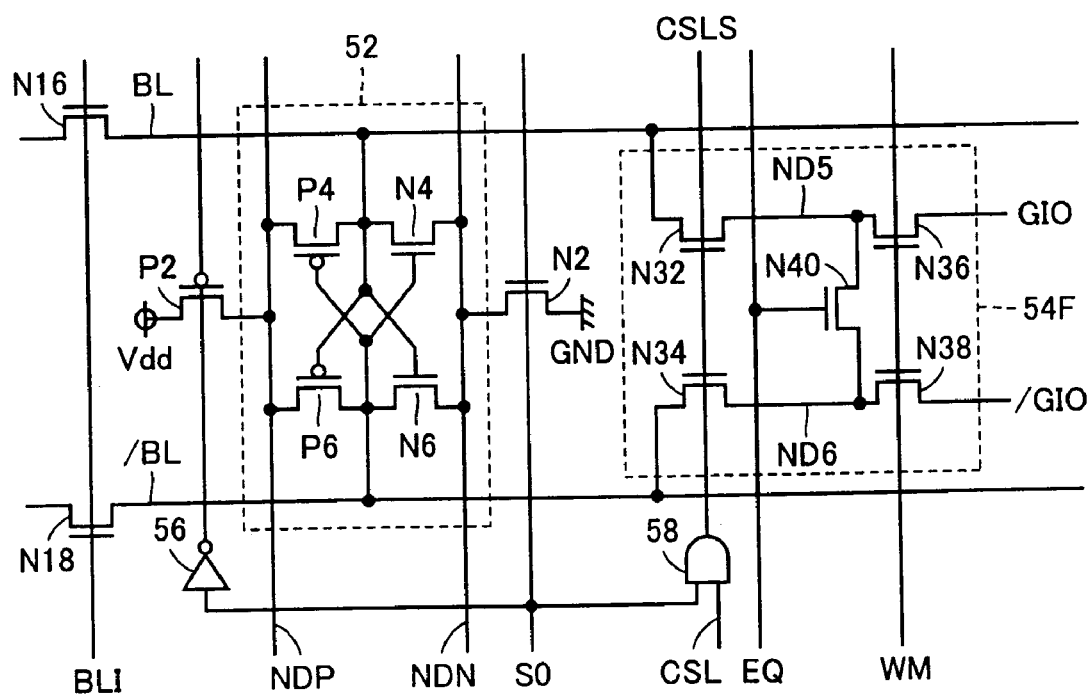
FIG. 15 is a circuit diagram showing a sense amplifier and its periphery in a case where the connection gate circuit in FIG. 13 has an equalize function.

FIG. 15 is a circuit diagram showing a sense amplifier and its periphery in the case where the connection gate circuit shown in FIG. 13 has an equalize function.

With reference to FIG. 15, the circuit includes a connection gate circuit 54F instead of connection gate circuit 54E in the circuit configuration shown in FIG. 13. Connection gate circuit 54F additionally includes an N channel MOS transistor N40 in the configuration of connection gate circuit 54E shown in FIG. 13. N channel MOS transistor N40 is connected between nodes ND5 and ND6, and has its gate receiving equalize signal EQ.

When equalize signal EQ output from the input/output control circuit (not shown) is at the H level, N channel MOS transistor N40 is turned on, and causes nodes ND5 and ND6 to attain the same potential. That is, N channel MOS transistor N40 forms an "equalize circuit." A function of this equalize circuit is the same as the equalize function of N channel MOS transistor N20 described in the first embodiment.

As described above, the semiconductor memory device in accordance with the third embodiment can produce the effect similar to that of the first embodiment.

In addition, output signal CSLS from AND gate 58 receiving sense amplifier activation signal S0 and column selection signal CSL as its input signals is utilized in the connection gate circuit. Therefore, the number of elements in the overall circuit can be reduced. Furthermore, a layout efficiency of the circuit can be improved. As a result, the circuit area can be decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell storing data;
   a pair of bit lines connected to said memory cell;
   a sense amplifier provided corresponding to said pair of bit lines and activated in response to a sense amplifier activation signal;
   a pair of I/O lines transmitting said data input/output to/from said memory cell via said pair of bit lines; and
   a connection gate circuit provided between said pair of bit lines and said pair of I/O lines and electrically connecting said pair of bit lines to said pair of I/O lines when said sense amplifier activation signal and a column selection signal selecting said pair of bit lines are both activated; wherein
   said connection gate circuit includes first and second gates connected in series between said pair of bit lines and said pair of I/O lines,
   said first gate conducts in response to said sense amplifier activation signal, and
   said second gate conducts in response to said column selection signal.

2. The semiconductor memory device according to claim 1, wherein said connection gate circuit further includes an equalize circuit equalizing potentials of a pair of nodes connecting said first gate with said second gate.

3. The semiconductor memory device according to claim 1, further comprising:
   another memory cell storing data;
   another pair of bit lines connected to said another memory cell;
   another sense amplifier provided corresponding to said another pair of bit lines and activated in response to said sense amplifier activation signal; and
   another connection gate circuit provided between said another pair of bit lines and said pair of I/O lines and electrically connecting said another pair of bit lines to said pair of I/O lines when said sense amplifier activation signal and another column selection signal selecting said another pair of bit lines are both activated; wherein
   said another connection gate circuit includes a third gate conducting in response to said another column selection signal,
   said second gate is connected between said pair of bit lines and said first gate, and
   said third gate is connected between said another pair of bit lines and said first gate.

4. The semiconductor memory device according to claim 3, further comprising:
   at least one first N type transistor turned on in response to said sense amplifier activation signal and activating said sense amplifier and said another sense amplifier; wherein
   said first gate is a second N type transistor, and
   said second N type transistor is formed in a free space of a region where said at least one first N type transistor is formed.

5. A semiconductor memory device comprising:
   a memory cell storing data;
   a pair of bit lines connected to said memory cell;
   a sense amplifier provided corresponding to said pair of bit lines and activated in response to a sense amplifier activation signal;
   a pair of I/O lines transmitting said data input/output to/from said memory cell via said pair of bit lines;
   a connection gate circuit provided between said pair of bit lines and said pair of I/O lines and electrically connecting said pair of bit lines to said pair of I/O lines when said sense amplifier activation signal and a column selection signal selecting said pair of bit lines are both activated; and
   a logic gate circuit activating its output signal when said sense amplifier activation signal and said column selection signal are activated; wherein
   said connection gate circuit includes a gate conducting in response to said output signal from said logic gate circuit.

6. The semiconductor memory device according to claim 5, wherein said logic gate circuit is provided at a shunt portion on a memory cell array where said memory cell is formed.

7. The semiconductor memory device according to claim 5, wherein said logic gate circuit is provided at an array control portion controlling an operation of a memory cell array where said memory cell is formed.

8. A semiconductor memory device comprising:
   a memory cell storing data;
   a pair of bit lines connected to said memory cell;
   a sense amplifier provided corresponding to said pair of bit lines and activated in response to a sense amplifier activation signal;
   a pair of I/O lines transmitting said data input/output to/from said memory cell via said pair of bit lines;
   a connection gate circuit provided between said pair of bit lines and said pair of I/O lines and electrically connecting said pair of bit lines to said pair of I/O lines when said sense amplifier activation signal and a column selection signal selecting said pair of bit lines are both activated; and
   a logic gate circuit activating its output signal when said sense amplifier activation signal and said column selection signal are activated; wherein said connection gate circuit includes a gate conducting in response to said output signal from said logic gate circuit; wherein
said connection gate circuit further includes another gate conducting in response to a write mask signal, and
said gate and said another gate are connected in series between said pair of bit lines and said pair of I/lines.

9. The semiconductor memory device according to claim 8, wherein said connection gate circuit further includes an equalize circuit equalizing potentials of a pair of nodes connecting said gate with said another gate.

* * * * *